US009577183B2

(12) United States Patent
Kim et al.

(10) Patent No.: US 9,577,183 B2
(45) Date of Patent: Feb. 21, 2017

(54) METHODS OF MANUFACTURING A MAGNETORESISTIVE RANDOM ACCESS MEMORY DEVICE

(71) Applicant: SAMSUNG ELECTRONICS CO., LTD., Suwon-si (KR)

(72) Inventors: Kyoung-Sun Kim, Suwon-si (KR); Woo-Jin Kim, Yongin-si (KR); Ken Tokashiki, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 6 days.

(21) Appl. No.: 14/611,717

(22) Filed: Feb. 2, 2015

(65) Prior Publication Data
US 2015/0287911 A1 Oct. 8, 2015

(30) Foreign Application Priority Data
Apr. 3, 2014 (KR) .......................... 10-2014-0039859

(51) Int. Cl.
*H01L 43/12* (2006.01)
*H01L 27/22* (2006.01)

(52) U.S. Cl.
CPC ............. *H01L 43/12* (2013.01); *H01L 27/228* (2013.01)

(58) Field of Classification Search
CPC ................................ H01L 43/12; H01L 27/228
See application file for complete search history.

(56) References Cited

U.S. PATENT DOCUMENTS

| 6,243,939 B1 | 6/2001 | Chen et al. |
| 6,768,110 B2 | 7/2004 | Alani |
| 7,291,506 B2 | 11/2007 | Nakajima et al. |
| 2009/0194833 A1* | 8/2009 | Wang ..................... B82Y 10/00 257/421 |
| 2010/0096263 A1 | 4/2010 | Sato et al. |
| 2012/0139019 A1* | 6/2012 | Iba ......................... H01L 27/228 257/295 |
| 2013/0008867 A1 | 1/2013 | Tokashiki et al. |
| 2013/0316536 A1* | 11/2013 | Seto ..................... H01L 21/2633 438/689 |

FOREIGN PATENT DOCUMENTS

| JP | 10-22274 A | 1/1998 |
| JP | 10-2013-0038603 A | 4/2013 |
| KR | 10-2012-0086938 A | 8/2012 |
| KR | 10-1222190 B1 | 1/2013 |

* cited by examiner

Primary Examiner — Kimberly Rizkallah
Assistant Examiner — Mounir Amer
(74) Attorney, Agent, or Firm — Sughrue Mion, PLLC

(57) ABSTRACT

In a method of manufacturing a MRAM device, a lower electrode is formed on a substrate. A first magnetic layer, a tunnel barrier layer, and a second magnetic layer are sequentially formed on the lower electrode layer. An etching mask is formed on the second magnetic layer. An ion beam etching process in which a first ion beam and a second ion beam are simultaneously emitted onto the substrate is performed to form a MTJ structure including a first magnetic layer pattern, a tunnel layer pattern, and a second magnetic layer pattern from the first magnetic layer, the tunnel barrier layer, and the second magnetic layer, respectively, the MTJ structure has no by-products remaining after the ion beam etching process is performed.

19 Claims, 11 Drawing Sheets

METHODS OF MANUFACTURING A MAGNETORESISTIVE RANDOM ACCESS MEMORY DEVICE

CROSS-REFERENCE TO RELATED APPLICATION

This application claims priority from Korean Patent Application No. 10-2014-0039859, filed on Apr. 3, 2014 in the Korean Intellectual Property Office (KIPO), the contents of which are herein incorporated by reference in their entirety.

BACKGROUND

1. Field

Exemplary embodiments relate to methods of manufacturing a magnetoresistive random access memory (MRAM) device. More particularly, exemplary embodiments relate to methods of forming a magnetic tunnel junction (MTJ) structure including a magnetic material containing, e.g., a transition metal and methods of manufacturing an MRAM device using the same.

2. Description of the Related Art

A related art MRAM device may execute writing and/or reading operation at a high speed and have non-volatile characteristics. The MRAM device may have an MTJ structure including a magnetic material, e.g., a metal having a magnetic characteristic. The magnetic material may not be easily etched. Therefore, a time for etching the magnetic material may increase. Also, process failures may be generated during etching the magnetic material.

SUMMARY

Exemplary embodiments provide a method of manufacturing an MRAM device in which process failures and a process time for manufacturing the MRAM device may be reduced.

According to an aspect of the exemplary embodiments, there is provided a method of manufacturing a magnetoresistive random access memory (MRAM) device. In the method, a lower electrode is formed on a substrate. A first magnetic layer, a tunnel barrier layer, and a second magnetic layer are sequentially formed on the lower electrode layer. An etching mask is formed on the second magnetic layer. An ion beam etching process in which a first ion beam and a second ion beam are simultaneously emitted onto the substrate is performed to form a magnetic tunnel junction (MTJ) structure including a first magnetic layer pattern, a tunnel layer pattern, and a second magnetic layer pattern from the first magnetic layer, the tunnel barrier layer, and the second magnetic layer, respectively, the MTJ structure has no by-products remaining after the ion beam etching process is performed, the first ion beam is emitted from a first ion beam source and has a first incident angle, and the second ion beam is emitted from a second ion beam source and has a second incident angle.

In exemplary embodiments, the first incident angle and the second incident angle may be different from each other.

In exemplary embodiments, the first incident angle may be about 60° to about 90°, and the second incident angle may be about 20° to about 50°.

In exemplary embodiments, when the ion beam etching process is performed, the substrate may be tilted to adjust the first incident angle and the second incident angle.

In exemplary embodiments, when the ion beam etching process is performed, at least one of the first ion beam source and the second ion beam source may be moved to change at least one of the first incident angle and the second incident angle, respectively.

In exemplary embodiments, when the ion beam etching process is performed, the first incident angle and the second incident angle may be adjusted. The adjusting of the first incident angle and the second incident angle may include tilting the substrate so that the second ion beam is incident on the substrate at the adjusted second incident angle, and moving the first ion beam source so that the first ion beam is incident on the tilted substrate at the adjusted first incident angle.

In exemplary embodiments, a first electrode layer between the lower electrode and the first magnetic layer may be further formed. The first electrode layer may be etched to form a first electrode by the ion beam etching process.

In exemplary embodiments, in the ion beam etching process, the first ion beam may etch the second magnetic layer, the tunnel barrier layer, and the first magnetic layer, and the second ion beam may remove the by-products on the MTJ structure.

In exemplary embodiments, a capping layer and an upper electrode layer between the second magnetic layer and the etching mask may be further formed.

In exemplary embodiments, the capping layer and the upper electrode layer may be further etched by a reactive ion etching process or the ion beam etching process.

In exemplary embodiments, the first magnetic layer, the tunnel barrier layer, and the second magnetic layer may be further etched by the ion beam etching process using at least one of the first ion beam and the second ion beam to form a preliminary magnetic tunnel junction (MTJ) structure which includes the by-products on a sidewall of the preliminary MTJ structure, after forming the etching mask.

In exemplary embodiments, the first ion beam and the second ion beam may be emitted onto the preliminary MTJ structure, and the first incident angle may be about 60° to about 90°, and the second incident angle may be about 20° to about 50°.

In exemplary embodiments, the first ion beam and the second ion beam may be incident on the preliminary MTJ structure, and each of the first incident angle and the second incident angle may be about 20° to about 50°.

According to an aspect of the exemplary embodiments, there is provided a method of manufacturing a magnetoresistive random access memory (MRAM) device. In the method, a metal-oxide-semiconductor (MOS) transistor having an impurity region is formed on a substrate. An insulating interlayer is formed on the substrate to cover the MOS transistor. A lower electrode contacting the impurity region of the MOS transistor is formed through the insulating interlayer layer. A first magnetic layer, a tunnel barrier layer, and a second magnetic layer are sequentially formed on the lower electrode and the insulating interlayer layer. An etching mask is formed on the second magnetic layer. An ion beam etching process in which a first ion beam and a second ion beam are simultaneously emitted onto the substrate is performed to form a magnetic tunnel junction (MTJ) structure including a first magnetic layer pattern, a tunnel layer pattern, and a second magnetic layer pattern from the first magnetic layer, the tunnel barrier layer, and the second magnetic layer, respectively, the MTJ structure has no by-products remaining after the ion beam etching process is performed, the first ion beam is emitted from a first ion beam source and has a first incident angle, and the second ion beam is emitted from a second ion beam source and has a second incident angle. A wiring is formed to electrically be connected to the second magnetic layer.

In exemplary embodiments, the first incident angle and the second incident angle may be different from each other.

According to an aspect of the exemplary embodiments, there is provided a method of performing an ion beam etching process. In the method, a first ion beam etching process is performed in which a first ion beam is emitted on a substrate, a lower electrode disposed on the substrate, and an etching target layer disposed on the lower electrode such that by-products are deposited onto a sidewall of a pattern structure. A second ion beam etching process is performed in which a second ion beam is emitted on the substrate, the lower electrode disposed on the substrate, and the etching target layer disposed on the lower electrode. A magnetic tunnel junction (MTJ) structure is formed comprising the pattern structure after the first ion beam etching process and the second ion beam etching process are performed. The MTJ structure has no by-products remaining after the first ion beam etching process and the second ion beam etching process are performed.

According to an aspect of the exemplary embodiments, conductive by-products on a sidewall of an MTJ structure may be reduced. Also, a time of etching for forming the MTJ structure may be reduced. Thus, an electrical short between first and second magnetic patterns or between the MTJ structures due to the by-products may be reduced. Additionally, an MRAM device having good electrical characteristics may be manufactured using the MTJ structure.

BRIEF DESCRIPTION OF THE DRAWINGS

Exemplary embodiments will be more clearly understood from the following detailed description taken in conjunction with the accompanying drawings.

FIGS. 1 to 5 are cross-sectional views illustrating stages of a method of forming an MTJ structure in accordance with exemplary embodiments;

FIGS. 6 and 7 are cross-sectional views illustrating stages of a method of forming an MTJ structure in accordance with exemplary embodiments;

FIGS. 8 and 9 are cross-sectional views illustrating stages of a method of forming an MTJ structure in accordance with exemplary embodiments;

FIGS. 10 and 11 are cross-sectional views illustrating stages of a method of forming an MTJ structure in accordance with exemplary embodiments;

FIGS. 12 and 13 are cross-sectional views illustrating stages of a method of forming an MTJ structure in accordance with exemplary embodiments;

FIGS. 14 to 18 are cross-sectional views illustrating a method of manufacturing an MRAM in accordance with exemplary embodiments;

FIG. 19 is a plan view illustrating an etching apparatus for forming MTJ structures in accordance with exemplary embodiments;

FIG. 20 is a cross-sectional view illustrating the etching apparatus of FIG. 19; and FIG. 21 is a block diagram illustrating a memory system in accordance with exemplary embodiments.

DETAILED DESCRIPTION OF EXEMPLARY EMBODIMENTS

Figure 1:
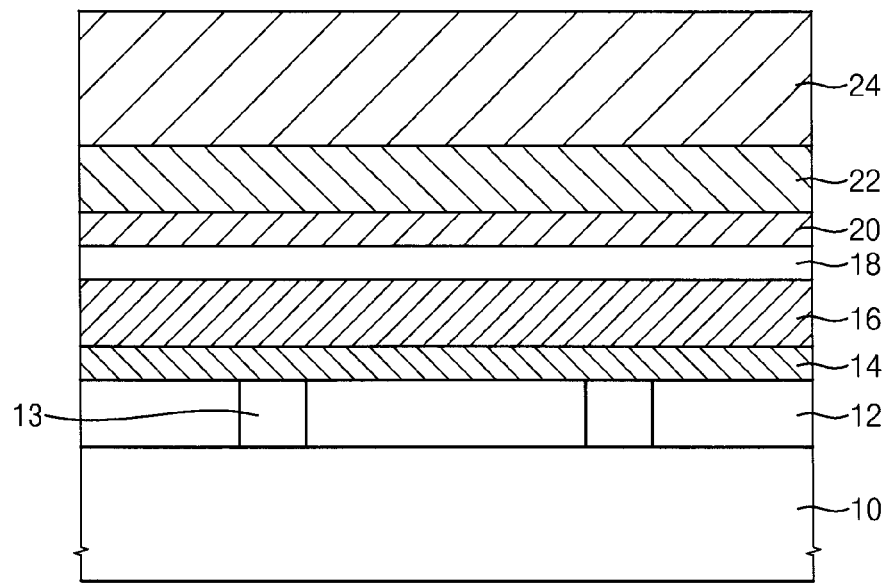
FIGS. 1 to 21 represent non-limiting, exemplary embodiments as described herein.

Various exemplary embodiments will be described more fully hereinafter with reference to the accompanying drawings, in which some exemplary embodiments are shown. The exemplary embodiments may, however, be embodied in many different forms and should not be construed as limited to the exemplary embodiments set forth herein. Rather, these exemplary embodiments are provided so that this description will be thorough and complete, and will fully convey the scope of the exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are cross-sectional views illustrating stages of a method of forming an MTJ structure in accordance with exemplary embodiments.

Referring to FIG. 1, a lower insulating layer 12 may be formed on a substrate 10. The substrate 10 may be a semiconductor substrate. The lower insulating layer 12 may include silicon nitride or silicon oxide.

A lower electrode 13 may be formed through the lower insulating layer 12. The lower electrode 13 may be formed to be electrically connected to a magnetic tunnel junction (MTJ) structure 28 (refer to FIG. 5) subsequently formed. Further, a shape of the lower electrode 13 may not be limited to that of FIG. 1. For example, the lower electrode 13 may have a pillar shape, a cylindrical shape, a linear shape, or the like. In exemplary embodiments, a plurality of lower electrodes 13 may be formed to have island shapes spaced apart from each other.

A first electrode layer 14 may be formed on the lower insulating layer 12. The first electrode layer 14 may be formed to include a metal, e.g., titanium, tantalum, etc., and/or a metal nitride, e.g., titanium nitride, tantalum nitride, etc. The first electrode layer 14 may be formed to have a single layer structure or a multi-layered structure. The first electrode layer 14 may serve as a pad layer between a first magnetic layer 16 and the lower electrode 13, so that the first magnetic layer 16 may be protected by the first electrode layer 14. In exemplary embodiments, the first electrode layer 14 may serve as a portion of the lower electrode 13 by subsequent processes. Alternatively, the first electrode layer 14 may not be formed. The first magnetic layer 16 may be formed on the first electrode layer 14. The first magnetic layer 16 may be formed to include a magnetic material, e.g., a transition metal. The first magnetic layer 16 may be formed to have a vertical magnetization direction. In exemplary embodiments, the first magnetic layer 16 may serve as a fixed layer of which a magnetization direction may be fixed. The first magnetic layer 16 may include, e.g., Pd, Co, Pt, Fe, Ru, Ta, Ni, B, Mn, Sb, AlCr, Mo, Si, Cu, Ir, or an alloy of at least two of the above materials. In exemplary embodiments, the first magnetic layer 16 may include CoFe, NiFe, CoFeB, etc. The first magnetic layer 16 may be formed to have a single layer structure or a multi-layered structure.

The first magnetic layer 16 may be formed to have a thickness greater than those of other layers in the MTJ structure 28. Thus, the first magnetic layer 16 may have good orientation characteristics and reduced crystal defects.

A tunnel barrier layer 18 may be formed on the first magnetic layer 16. The tunnel barrier layer 18 may be formed to include a metal oxide having an insulating property. The tunnel barrier layer 18 may include MgO or AlOx. A quantum mechanical tunneling may occur between the first magnetic layer 16 and a second magnetic layer 20 through the tunnel barrier layer 18. The tunnel barrier layer 16 may be formed to have a thin thickness of about 1 Å to about 100 Å.

The second magnetic layer 20 may be formed on the tunnel barrier layer 18. The second magnetic layer 20 may be formed to include a magnetic material, e.g., a transition metal. The second magnetic layer 20 may serve as a free layer of which a magnetization direction may be changed.

The second magnetic layer 20 may include, e.g., Pd, Co, Pt, Fe, Ru, Ta, Ni, B, Mn, Sb, AlCr, Mo, Si, Cu, Ir, or an alloy of at least two of the above materials. In exemplary embodiments, the second magnetic layer 20 may include CoFe, NiFe, CoFeB, etc. The second magnetic layer 20 may be formed to have a single layer structure or a multi-layered structure. The second magnetic layer 20 may be formed to have a thickness smaller than that of the first magnetic layer 16. The sum of the thicknesses of the first magnetic layer 16, the tunnel barrier layer 18, and the second magnetic layer 20 may be about 350 Å to about 400 Å. However, the sum of the thicknesses of the first magnetic layer 16, the tunnel barrier layer 18, and the second magnetic layer 20 may not be limited to the above.

In exemplary embodiments, the first magnetic layer 16 may serve as a fixed layer, and the second magnetic layer 20 may serve as a free layer. Alternatively, the first magnetic layer 16 may serve as a free layer, and the second magnetic layer 20 may serve as a fixed layer.

In exemplary embodiments, each of the first and second magnetic layers 16 and 20 may have a vertical magnetization direction. Alternatively, each of the first and second magnetic layers 16 and 20 may have a horizontal magnetization direction. In this case, the first magnetic layer 16 may be formed to include a lower layer (not shown) and an upper layer (not shown). The lower layer may be formed to include, e.g., PtMn, IrMn, FePt, CoPt, etc., and the upper layer may be formed to include, e.g., CoFe, NiFe, CoFeB, etc.

A capping layer 22 may be formed on the second magnetic layer 20. The capping layer 22 may be formed to include a metal, e.g., titanium, tantalum, etc., and/or a metal nitride, e.g., titanium nitride, tantalum nitride, etc. The capping layer 22 may be formed to have a single layer structure or a multi-layered structure.

An upper electrode layer 24 may be formed on the capping layer 22. The upper electrode layer 24 may be formed to include a metal, e.g., W, and/or a metal nitride, e.g., WN, etc. The upper electrode layer 24 may be formed to have a thickness greater than that of an upper electrode 24a (refer to FIG. 3) that may be subsequently formed from the upper electrode layer 24, so that the upper electrode layer 24 may not be completely removed during an etching process. Also, the upper electrode layer 24 may be formed to have a thickness greater than that of the capping layer 22.

Figure 2:
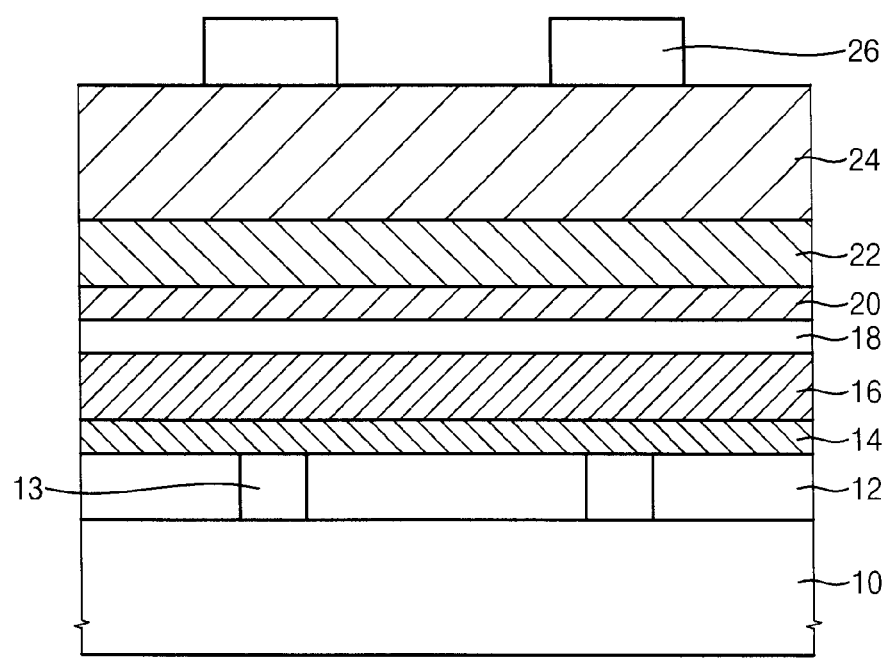

Referring to FIG. 2, a hard mask layer may be formed on the upper electrode layer 24. A photoresist pattern (not shown) may be formed on the hard mask layer by coating, exposing and developing a photoresist film (not shown). The hard mask layer may be etched using the photoresist pattern as an etching mask to form a hard mask 26. The hard mask 26 may be formed to include, e.g., silicon nitride.

Figure 3:
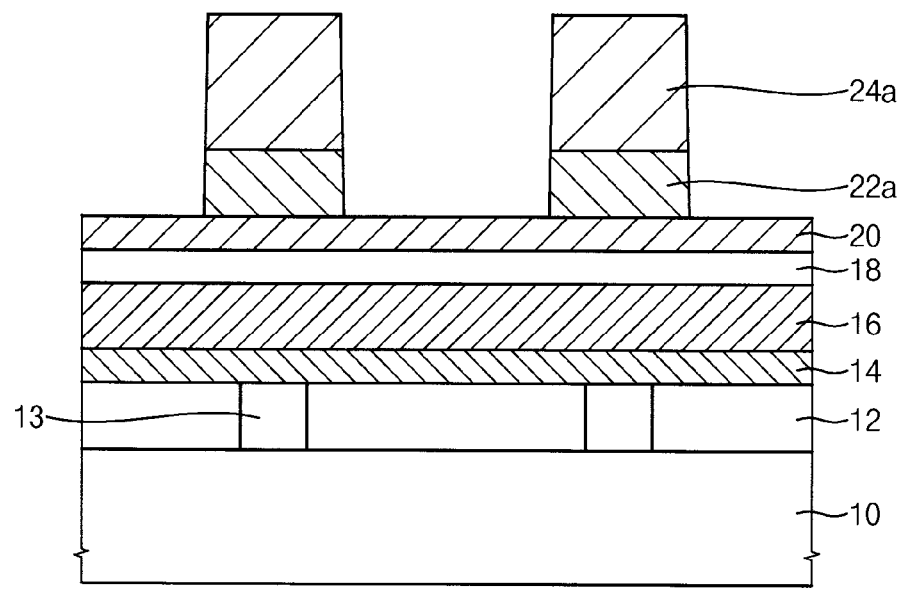

Referring to FIG. 3, the upper electrode layer 24 may be etched using the hard mask 26 as an etching mask to form an upper electrode 24a, and the capping layer 22 may be etched to form a capping pattern 22a. The hard mask 26 may be mostly or completely removed during the etching process.

The upper electrode layer 24 and the capping layer 22 may not include a magnetic material so as to be easily etched by the etching process, and no material may be re-deposited during the etching process. The upper electrode layer 24 and the capping layer 22 may be etched by a reactive ion etching (RIE) process or an ion beam etching (IBE) process. In exemplary embodiments, the upper electrode layer 24 and the capping layer 22 may be etched by the RIE process using an etching gas. Alternatively, the upper electrode layer 24 and the capping layer 22 may be etched by the IBE process in which an incident angle of an ion beam may be about 60° to about 90°.

Figure 4:
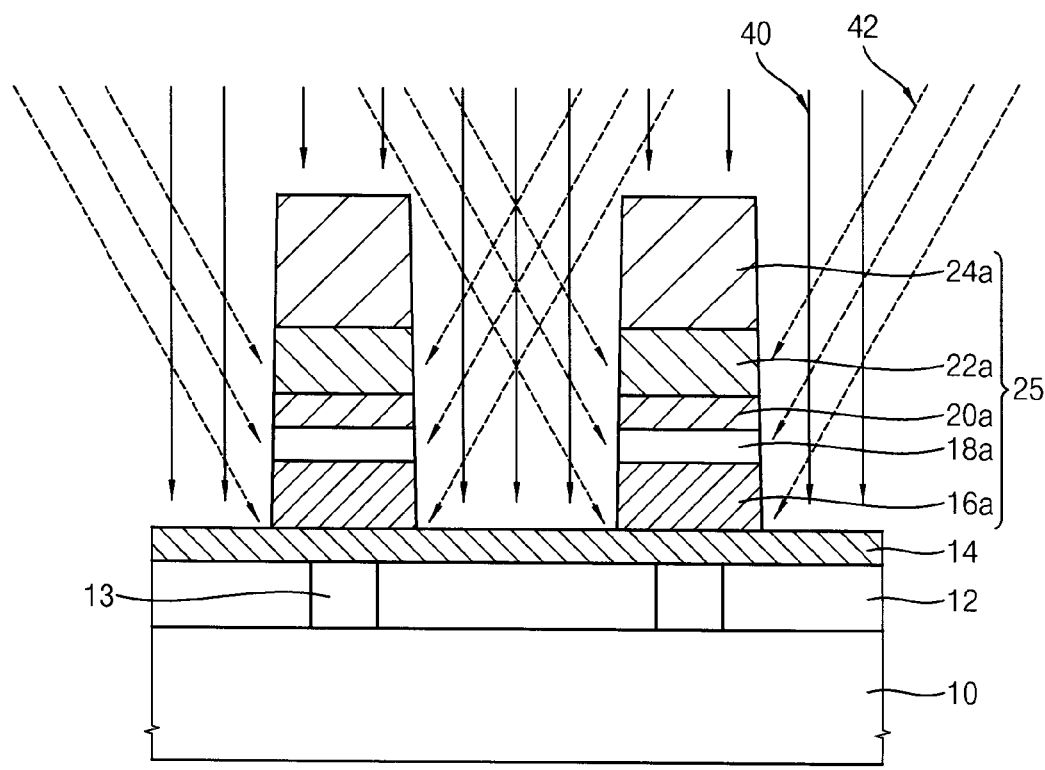

Referring to FIG. 4, the second magnetic layer 20, the tunnel barrier layer 18, and the first magnetic layer 16, which may be altogether referred to as an etching target layer, may be sequentially etched using the upper electrode 24a and the capping pattern 22a as an etching mask to form a second magnetic pattern 20a, a tunnel barrier pattern 18a, and a first magnetic pattern 16a, respectively. The first magnetic pattern 16a, the tunnel barrier pattern 18a, the second magnetic pattern 20a, the capping pattern 22a, and the upper electrode 24a may be altogether referred to as a pattern structure 25.

The etching target layer may be etched by a physical etching process, e.g., an IBE process. For example, the etching target layer may be etched by an argon ion sputter etching process. In the IBE process, no etching gas may be used.

When the etching target layer is etched, independent ion beam sources may emit ion beams, respectively, having different incident angles from each other onto the etching target layer. For example, a first ion beam 40 having a first incident angle with respect to a top surface of the substrate 10 may be emitted from a first ion beam source (not shown), and a second ion beam 42 having a second incident angle with respect to the top surface of the substrate 10 may be emitted from a second ion beam source (not shown). The first and second incident angles may be different from each other. The first incident angle may be adjusted so that the first ion beam 40 may etch the etching target layer, and the second incident angle may be adjusted so that the second ion beam 42 may remove by-products on the MTJ structure 28 during the etching process.

In the etching process, the substrate 10 may be rotated in a tilted state at a given angle. Also, at least one of the first and second ion sources may be moveable. At least one of the first and second incident angles may be adjusted by moving the at least one of the first and second ion sources. That is, the first and second incident angles may be adjusted by changing the tilted angle of the substrate 10 and/or moving the first and/or second ion sources.

In exemplary embodiments, when the first ion beam source is moveable, the first and second incident angles may be adjusted by the following processes. The substrate 10 may be tilted to an angle so that the second ion beam 42 emitted from the second ion beam source may have a second incident angle. Also, the first ion beam source may be moved so that the first ion beam 40 emitted from the first ion beam source may have a first incident angle with respect to the tilted substrate 10. However, the order of adjusting the first and second incident angles may not be limited to the above. That is, any one of the first and second incident angles, regardless of the magnitude thereof may be adjusted first, and the other one of the first and second incident angles may be adjusted later. An incident angle of an ion beam emitted from an immobile ion beam source may be adjusted by tilting the substrate 10, and an incident angle of an ion beam emitted from a movable ion beam source may be adjusted by moving the ion beam source.

Therefore, the first and second ion beams 40 and 42 having different incident angles may be emitted onto the substrate 10. The first and second ion beam sources may generate the first and second ion beams 40 and 42, respectively, by capacitively coupled plasma (CCP) or inductively coupled plasma (ICP).

In exemplary embodiments, the first incident angle may be about 60° to about 90°. The first ion beam 40 may be accelerated to be incident onto the substrate 10 at an incident angle higher than about 60°, so that the etching target layer may be etched. The first ion beam 40 may etch the etching target layer. In the etching process, conductive by-products may be re-deposited onto a sidewall of the pattern structure 25 due to the high incident angle of the first ion beam 40.

In exemplary embodiments, the second incident angle may be about 20° to about 50°. The second ion beam 42 may have an incident angle lower than about 50° so as to be incident onto the sidewall of the pattern structure 25. Therefore, the conductive by-products that may be re-deposited onto the sidewall of the pattern structure 25 may be removed.

When layers under the tunnel barrier pattern 18a are etched, the by-products may be re-deposited onto the sidewall of the tunnel barrier pattern 18a. Thus, the first and second magnetic patterns 16a and 20a may be electrically short. However, in exemplary embodiments, the first ion beam 40 having the first incident angle and the second ion beam 42 having the second incident angle may be simultaneously emitted onto the etching target layer, so that the by-products may be removed while the pattern structure 25 may be formed.

When a space between the pattern structures 25 are so small and/or the pattern structures 25 have such a high aspect ratio, an ion beam having a low incident angle may not reach the space between the pattern structures 25 because of a shadow effect. However, in exemplary embodiments, the second ion beam 42 may not be emitted after forming the pattern structure 25, but may be emitted simultaneously with the first ion beam 40 during the etching process. Thus, the second ion beam 42 may continuously remove the by-products while the pattern structure 25 may be formed. Therefore, even though the space between the pattern structures 25 may be so small and/or the pattern structures 25 may have such a high aspect ratio, the second ion beam 42 may reach the space between the pattern structures 25. Thus, the by-products may be effectively removed.

Figure 5:
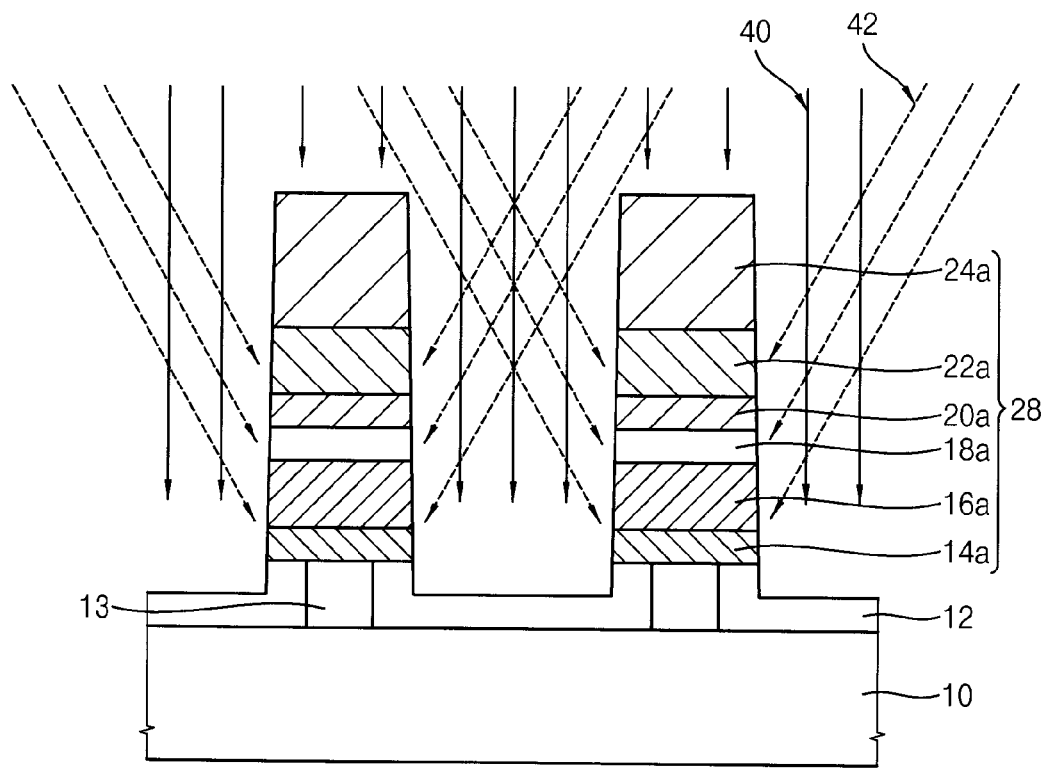

Referring to FIG. 5, the first electrode layer 14 and a portion of the lower insulating layer 12 may be etched by the etching process. That is, the first electrode layer 14 and the portion of the lower insulating layer 12 may be etched by the IBE process in which the first and second ion beams 40 and 42 may be simultaneously emitted, so that a first electrode 14a and a recess of the lower insulating layer 12 may be formed.

The lower insulating layer 12 may be over-etched so that the first electrode layer 14 may be sufficiently patterned to form the first electrode 14a. In the etching process, the MTJ structure 28 including the first electrode 14a, the first magnetic pattern 16a, the tunnel barrier pattern 18a, the second magnetic pattern 20a, the capping pattern 22a, and the upper electrode 24a may be formed to be sequentially stacked. The upper electrode 24a, which may serve as an etching mask, may remain after the etching process.

When the first electrode layer 14 and the lower insulating layer 12 are etched, conductive by-products may be re-deposited onto the sidewall of the pattern structure 25. For example, the MTJ structures 28 may be electrically short due to conductive by-products re-deposited between the first electrodes 14a.

However, in exemplary embodiments, the first electrode 14a and the lower insulating layer 12 may be formed by the IBE process in which the first and second ion beams 40 and 42 may be simultaneously emitted. Thus, the by-products may be removed by the second ion beam 42 while the MTJ structure 28 may be formed. Accordingly, the MTJ structure 28 with no by-products may be formed.

In exemplary embodiments, additional processes for removing the by-products are not needed. Thus, a time for forming the MTJ structure 28 may be decreased. Additionally, no by-products or very little by-products may be formed on the sidewall of the MTJ structure 28 and in the space between the MTJ structures 28, so that an electrical short between the MTJ structures 28 due to the by-products may be reduced.

Figure 6:
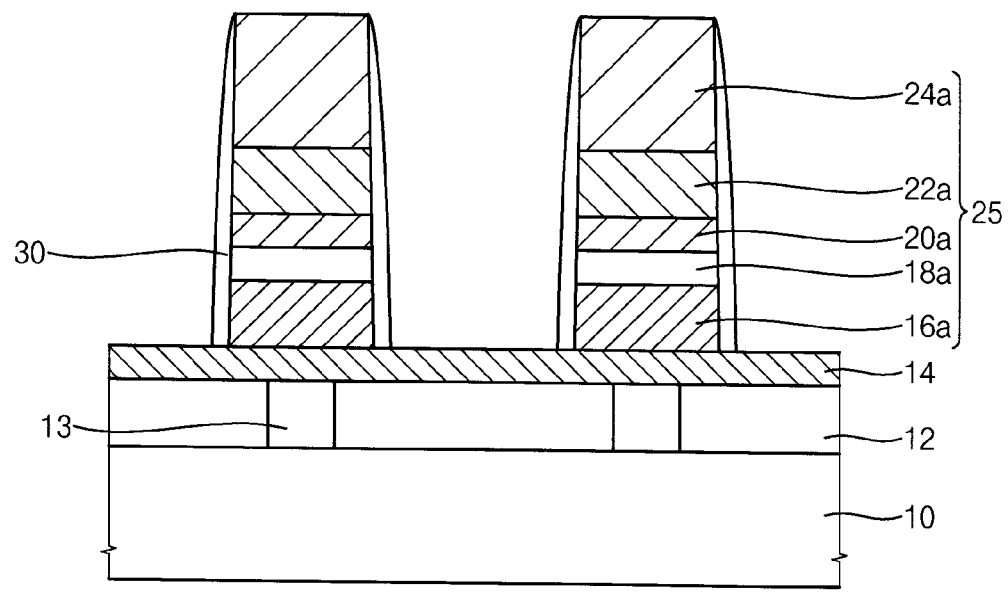
Figure 7:
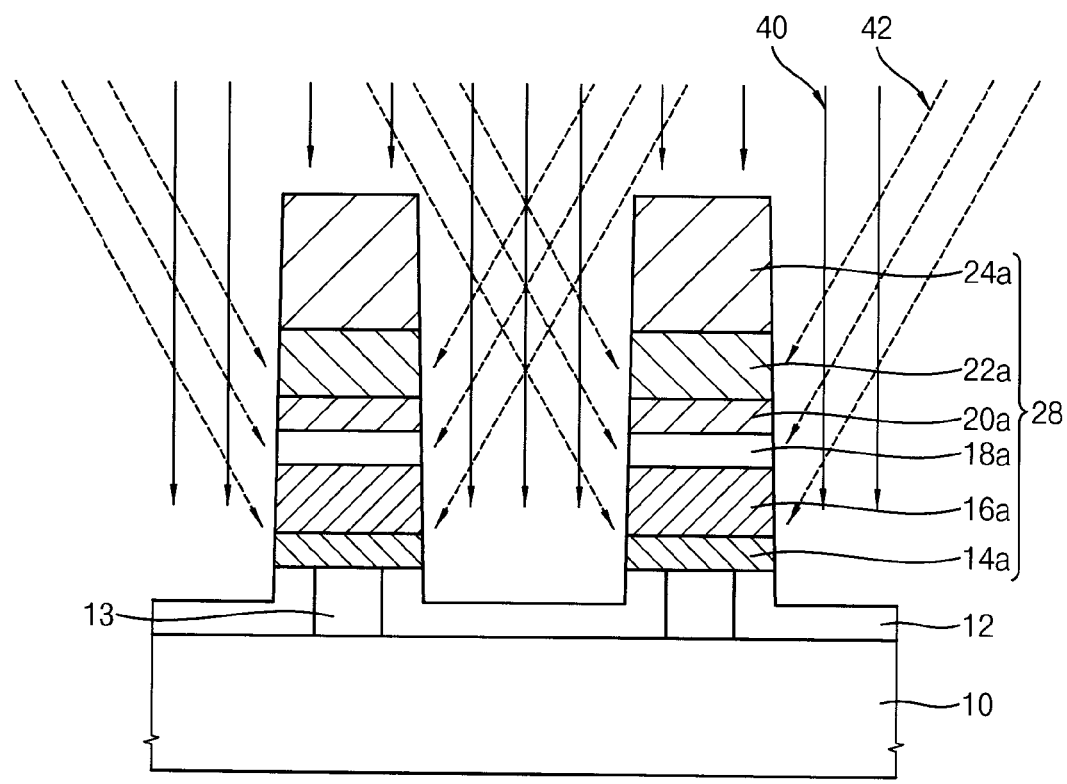

FIGS. 6 and 7 are cross-sectional views illustrating stages of a method of forming an MTJ structure in accordance with exemplary embodiments.

This method may include substantially the same as or similar to those illustrated with reference to FIGS. 1 to 5 except for a process for etching the etching target layer.

First, processes substantially the same as or similar to those illustrated with reference to FIGS. 1 to 3 may be performed to form the structure of FIG. 3.

Referring to FIG. 6, the second magnetic layer 20, the tunnel barrier layer 18, and the first magnetic layer 16, which may be altogether referred to as an etching target layer, may be sequentially etched using the upper electrode 24a and the capping pattern 22a as an etching mask to form a second magnetic pattern 20a, a tunnel barrier pattern 18a, and a first magnetic pattern 16a, respectively. The first magnetic pattern 16a, the tunnel barrier pattern 18a, the second magnetic pattern 20a, the capping pattern 22a and the upper electrode 24a may be altogether referred to as a pattern structure 25.

The etching target layer may be etched by an RIE process using an etching gas. For example, the etching gas may include HF and/or NH$_3$ In the RIE process, a reactant gas including oxygen (O$_2$) may be further used.

When a layer including a magnetic material may be etched by the RIE process, an etched magnetic material may be re-deposited onto a sidewall of the pattern structure 25. That is, conductive by-products 30 may be re-deposited onto a sidewall of the pattern structure 25 that may be formed by the RIE process.

Referring to FIG. 7, the first electrode layer 14 and a portion of the lower insulating layer 12 may be etched using the upper electrode 24a and the capping pattern 22a as an etching mask to form a first electrode pattern 14a and a recess of the lower insulating layer 12. In the etching process, an MTJ structure 28 including the first electrode 14a, the first magnetic pattern 16a, the tunnel barrier pattern 18a, the second magnetic pattern 20a, the capping pattern 22a, and the upper electrode 24a may be formed to be sequentially stacked.

The first electrode layer 14 and a portion of the lower insulating layer 12 may be etched by a physical etching process, e.g., an IBE process. When the first electrode layer 14 and the portion of the lower insulating layer 12 are etched, independent ion beam sources may emit ion beams, respectively, having different incident angles from each other onto the layers. For example, a first ion beam 40 having a first incident angle with respect to a top surface of the substrate 10 may be emitted from a first ion beam source (not shown), and a second ion beam 42 having a second incident angle with respect to the top surface of the substrate 10 may be emitted from a second ion beam source (not shown). That is, the first ion beam 40 having the first incident angle and the second ion beam 42 having the second incident angle may be simultaneously emitted onto the top surface of the substrate 10. The first and second incident angles may be different from each other.

In example embodiments, the first incident angle may be about 60° to about 90°, so that the first ion beam 40 may etch the first electrode layer 14 and a portion of the lower insulating layer 12. Also, conductive by-products that may be re-deposited onto a sidewall of the first electrode pattern 14a and the recess of the lower insulating layer 12 may be removed by the first ion beam 40.

In exemplary embodiments, the second incident angle may be about 20° to about 50°. The second ion beam 42 may have an incident angle lower than about 50°, so that the second ion beam 42 may etch the conductive by-products that may be re-deposited onto the sidewall of the pattern structure 25.

In exemplary embodiments, no by-products or very little by-products may be formed on the sidewall of the MTJ structure 28 and in the space between the MTJ structures 28, so that an electrical short between the MTJ structures 28 due to the by-products may be reduced.

Figure 8:
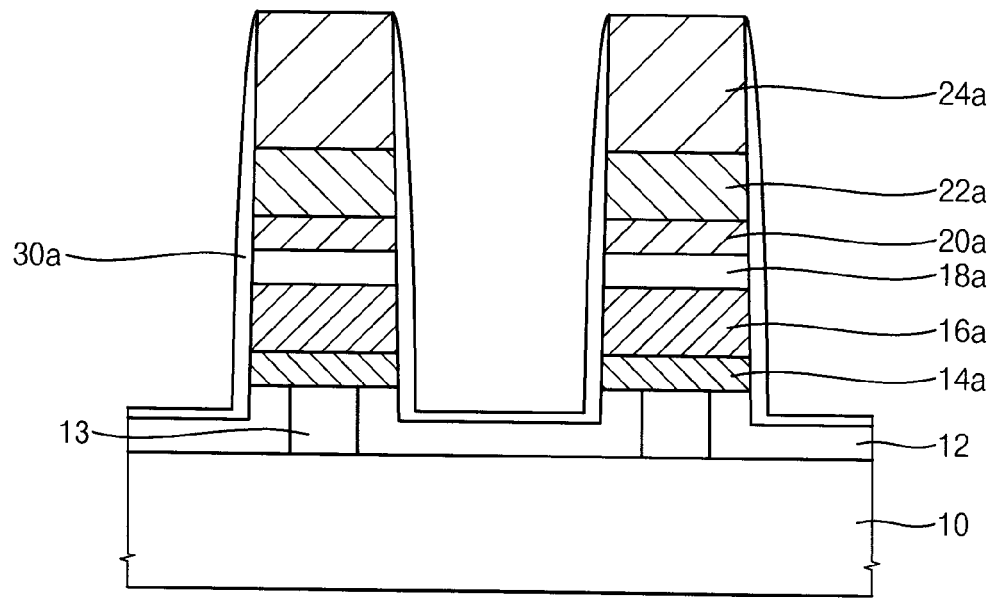
Figure 9:
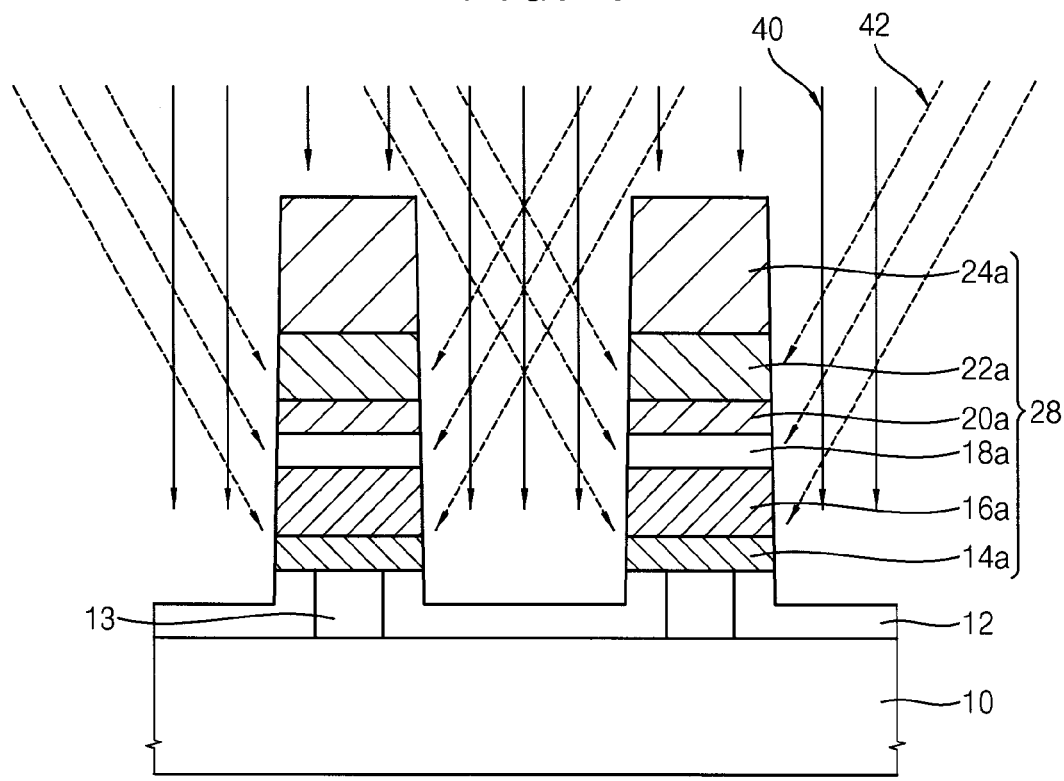

FIGS. 8 and 9 are cross-sectional views illustrating stages of a method of forming an MTJ structure in accordance with exemplary embodiments.

This method may include substantially the same as or similar to those illustrated with reference to FIGS. 1 to 5 except for a process for etching the etching target layer.

First, processes substantially the same as or similar to those illustrated with reference to FIGS. 1 to 3 may be performed to form the structure of FIG. 3.

Referring to FIG. 8, the second magnetic layer 20, the tunnel barrier layer 18, the first magnetic layer 16, the first electrode layer 14, and a portion of the lower insulating layer 12 may be sequentially etched using the upper electrode 24a and the capping pattern 22a as an etching mask to form a pattern structure including a second magnetic pattern 20a, a tunnel barrier pattern 18a, a first magnetic pattern 16a, and a first electrode pattern 14a on the lower insulating layer 12, respectively.

The second magnetic layer 20, the tunnel barrier layer 18, the first magnetic layer 16, the first electrode layer 14, and the portion of the lower insulating layer 12 may be etched by an RIE process using an etching gas. Thus, conductive by-products 30a may be re-deposited onto a sidewall of the pattern structure and in a space between the pattern structures.

Referring to FIG. 9, the conductive by-products 30a may be removed by a second etching process to form an MTJ structure having no by-product and including the first electrode pattern 14a, the first magnetic pattern 16a, the tunnel barrier pattern 18a, the second magnetic pattern 20a, and the upper electrode pattern 24a.

The second etching process may include a physical etching process, e.g., an IBE process. In the second etching process, independent ion beam sources may emit ion beams, respectively, having different incident angles from each other onto the layers, so that the conductive by-products may be removed. For example, a first ion beam 40 having a first incident angle with respect to a top surface of the substrate 10 may be emitted from a first ion beam source (not shown), and a second ion beam 42 having a second incident angle with respect to the top surface of the substrate 10 may be emitted from a second ion beam source (not shown). That is, the first ion beam 40 having the first incident angle and the second ion beam 42 having the second incident angle may be simultaneously emitted onto the top surface of the substrate 10. The first and second incident angles may be different from each other.

In exemplary embodiments, the first incident angle may be about 60° to about 90°, so that the first ion beam 40 may etch the conductive by-products between the pattern structures. Also, when the sidewall of the pattern structure has a protruding portion, the protruding portion may be etched by the first ion beam 40. Therefore, the sidewall of the pattern structure may have a good profile.

In exemplary embodiments, the second incident angle may be about 20° to about 50°. The second ion beam 42 may have an incident angle lower than about 50°, so that the second ion beam 42 may etch the conductive by-products on the sidewall of the pattern structure.

In exemplary embodiments, no by-products or very little by-products may be formed on the sidewall of the MTJ structure 28 and in the space between the MTJ structures 28, so that an electrical short between the MTJ structures 28 due to the by-products may be reduced.

Figure 10:
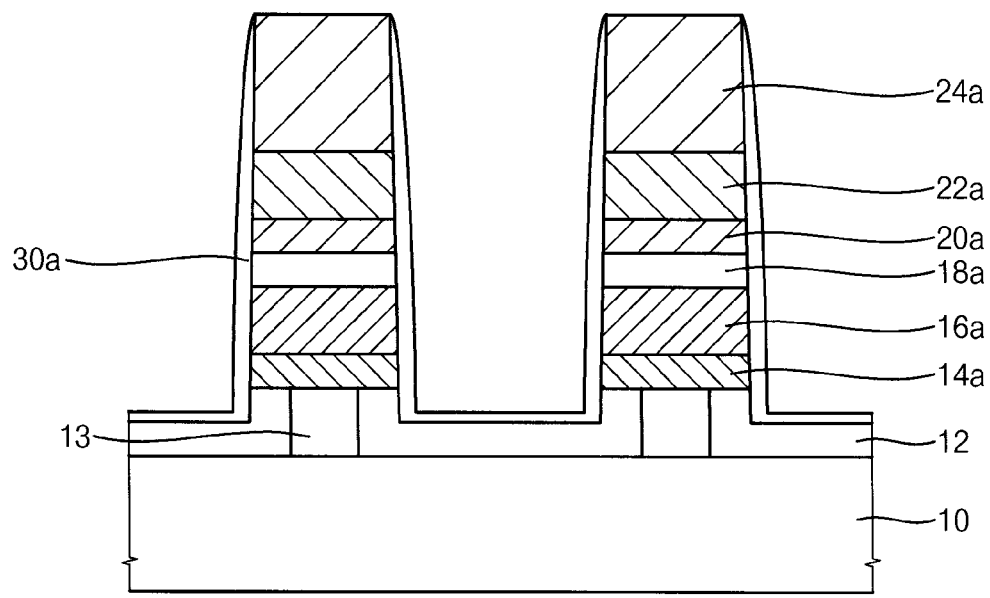
Figure 11:
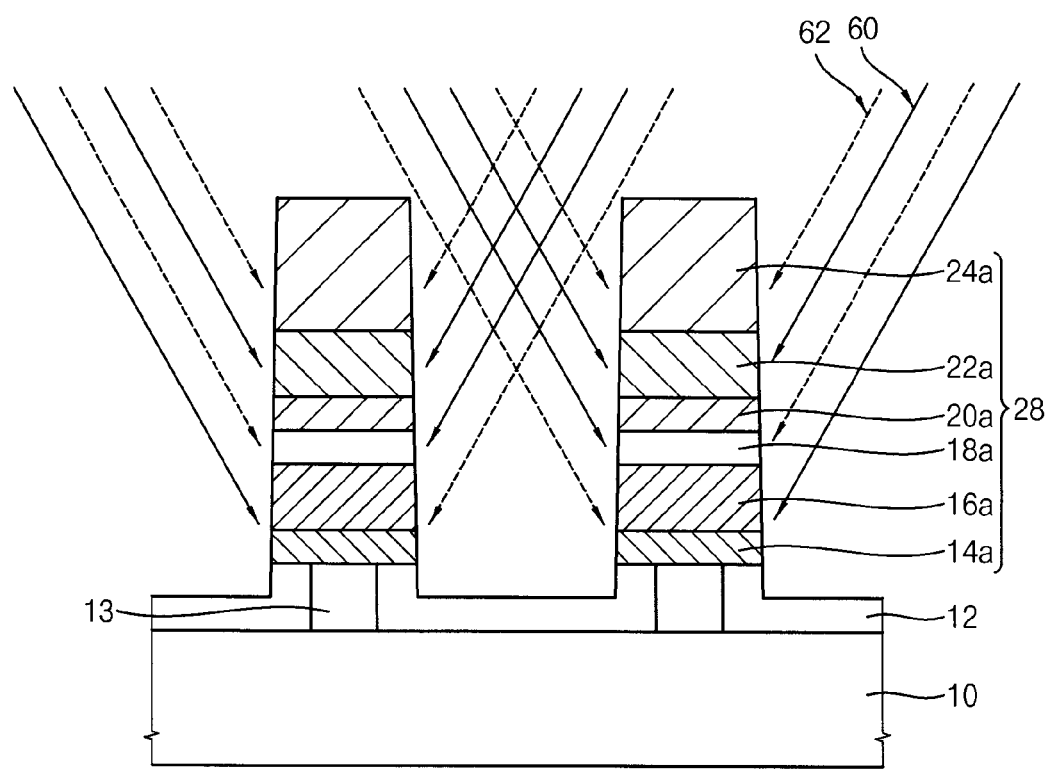

FIGS. 10 and 11 are cross-sectional views illustrating stages of a method of forming an MTJ structure in accordance with exemplary embodiments.

This method may include substantially the same as or similar to those illustrated with reference to FIGS. 1 to 5 except for a process for etching the etching target layer.

First, processes substantially the same as or similar to those illustrated with reference to FIGS. 1 to 3 may be performed to form the structure of FIG. 3.

Referring to FIG. 10, the second magnetic layer 20, the tunnel barrier layer 18, the first magnetic layer 16, the first electrode layer 14, and a portion of the lower insulating layer 12 may be sequentially etched using the upper electrode 24a and the capping pattern 22a as an etching mask to form a pattern structure including a second magnetic pattern 20a, a tunnel barrier pattern 18a, a first magnetic pattern 16a, and a first electrode pattern 14a on the lower insulating layer 12.

The second magnetic layer 20, the tunnel barrier layer 18, the first magnetic layer 16, the first electrode layer 14, and the portion of the lower insulating layer 12 may be etched by an RIE process using an etching gas. Also, conductive by-products 30a may be re-deposited onto a sidewall of the pattern structure and in a space between the pattern structures.

Referring to FIG. 11, the conductive by-products 30a may be removed by a second etching process to form an MTJ structure having no by-product and including the first electrode pattern 14a, the first magnetic pattern 16a, the tunnel barrier pattern 18a, the second magnetic pattern 20a, and the upper electrode pattern 24a.

The second etching process may include a physical etching process, e.g., an IBE process. In the second etching process, independent ion beam sources may emit ion beams, respectively, so that the conductive by-products 30a may be removed. The ion beams may have incident angles with respect to a top surface of the substrate 10, respectively, for etching the conductive by-products 30a on the sidewall of the pattern structure. For example, a first ion beam 40 having a first incident angle with respect to the top surface of the substrate 10 may be emitted from a first ion beam source (not shown), and a second ion beam 42 having a second incident angle with respect to the top surface of the substrate 10 may be emitted from a second ion beam source (not shown). In exemplary embodiments, the first and second incident angles may be about 20° to about 50°. The first and second incident angles may be substantially the same as or different from each other.

The first and second incident angles may have a value lower than about 50°, so that the first and second ion beams may etch the conductive by-products 30a on the sidewall of the pattern structure. The conductive by-products 30a may be rapidly removed because the first and second ion beams may be simultaneously emitted onto the conductive by-products 30a.

In exemplary embodiments, the conductive by-products 30a may be removed in a short time. Also, no by-products or very little by-products may be formed on the sidewall of the MTJ structure 28, so that an electrical short between the MTJ structures 28 due to the by-products may be reduced.

Figure 12:
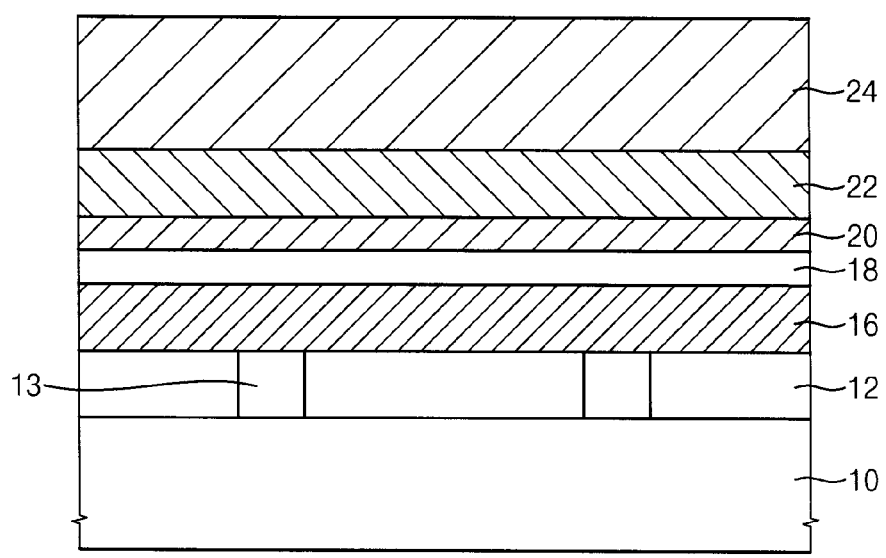
Figure 13:
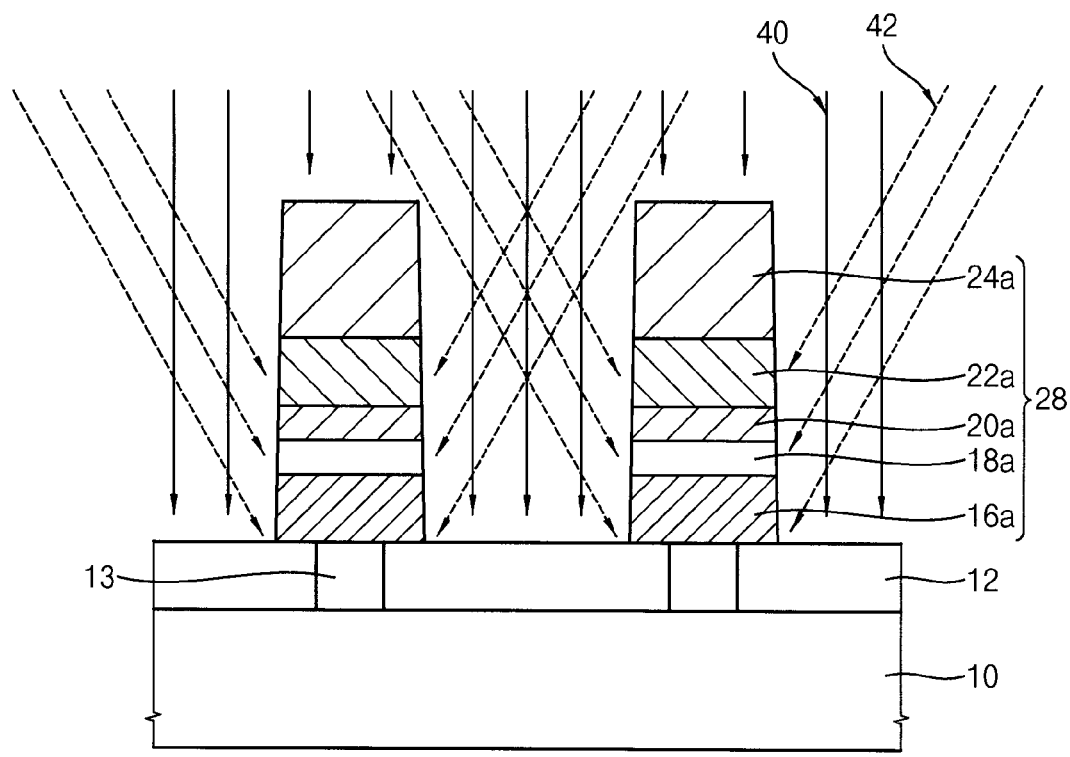

FIGS. 12 and 13 are cross-sectional views illustrating stages of a method of forming an MTJ structure in accordance with exemplary embodiments.

This method may include substantially the same as or similar to those illustrated with reference to FIGS. 2 to 5, except that the first electrode layer may not be formed.

Referring to FIG. 12, a lower insulating layer 12 may be formed on a substrate 10. The lower insulating layer 12 may include silicon nitride or silicon oxide.

A lower electrode 13 may be formed through the lower insulating layer 12. The lower electrode 13 may be formed to be electrically connected to an MTJ structure 28 (refer to FIG. 13) subsequently formed, and a shape of the lower electrode 13 may not be limited to that of FIG. 12. In exemplary embodiments, the lower electrode 13 may have a pillar shape, a cylindrical shape, a linear shape, or the like.

A first magnetic layer 16 may be formed on the lower electrode 13 and lower insulating layer 12. A tunnel barrier layer 18, a second magnetic layer 20, a capping layer 22, and upper electrode layer 24 may be sequentially formed on the first magnetic layer 16.

Referring to FIG. 13, the MTJ structure 28 including a first magnetic pattern 16a, a tunnel barrier pattern 18a, a second magnetic pattern 20a, a capping pattern 22a, and an upper electrode 24a may be formed by the processes substantially the same as or similar to those illustrated with reference to FIGS. 2 to 4. The MTJ structure 28 may be formed on the lower electrode 12, and have no conductivity by-product on the sidewall thereof.

Alternately, the first magnetic pattern 16a, the tunnel barrier pattern 18a, the second magnetic pattern 20a may be formed by the processes substantially the same as or similar to those illustrated with reference to FIGS. 8 and 9 or to FIGS. 10 and 11. That is, the first magnetic pattern 16a, the tunnel barrier pattern 18a, the second magnetic pattern 20a having no conductivity by-product may be formed by the etching processes in accordance with exemplary embodiments.

FIGS. 14 to 18 are cross-sectional views illustrating a method of manufacturing a magnetoresistive random access memory (MRAM) device in accordance with exemplary embodiments. In exemplary embodiments, the MRAM device may be an spin transfer torque magnetoresistive random access memory (STT-MRAM) device.

Figure 14:
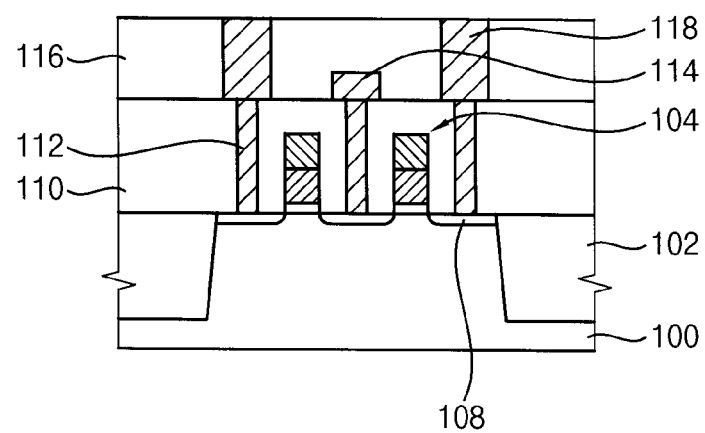

Referring to FIG. 14, an isolation pattern 102 may be formed on a substrate 100 to define an active region and a field region in the substrate 100. A metal-oxide-semiconductor (MOS) transistor for selecting memory cells may be formed on the substrate 100. In particular, a gate insulation layer (not shown), a gate electrode layer (not shown) and a gate mask layer (not shown) may be sequentially formed on the substrate 100. After forming a gate mask (not shown) from the gate mask layer by a photolithography process, the gate electrode layer and the gate insulation layer may be sequentially patterned to form a gate electrode (not shown)

and a gate insulation layer pattern (not shown), respectively. The gate insulation layer pattern, the gate electrode, and the gate mask sequentially stacked on the substrate 100 may form a gate structure 104. Impurities may be doped into an upper portion of the substrate 100 adjacent to the gate structure 104 to form an impurity region 108. The gate structure 104 may serve as a word line, and may extend in a first direction substantially perpendicular to a second direction in which the active region may extend. A gate spacer (not shown) may be further formed on a sidewall of the gate structure 104.

In exemplary embodiments, two gate structures 104 may be formed in each active region, and three impurity regions 108 may be formed in each active region. One of the impurity regions 108 between the two gate structures 104 may serve as a common source region, and the other two of the impurity regions 108 may serve as drain regions.

A first insulating interlayer 110 may be formed on the substrate to cover the MOS transistor. A first contact plug 112 may be formed through the first insulating interlayer 110 to contact the impurity region 108. In exemplary embodiments, three first contact plugs 112 may be formed to contact the three impurity regions 108, respectively, in each active region.

A conductive layer may be formed on the first insulating interlayer 110 and the first contact plug 112, and the conductive layer may be patterned to form a source line 114. The source line 114 may be formed on one of the first contact plugs 112 to be electrically connected to the common source line 114, and extend in the first direction.

A second insulating interlayer 116 may be formed on the first insulating interlayer 110 to cover the source line 114. A second contact plug 118 may be formed through the second insulating interlayer 116 to contact the first contact plug 112. In exemplary embodiments, the second contact plug 118 may be electrically connected to the drain region via the first contact plug 112. The second insulating interlayer 116 may be formed to include, e.g., silicon nitride. The second insulating interlayer 116 may correspond to a lower insulating layer 12 of the FIG. 1. The second contact plug 118 may correspond to a lower electrode 13 of the FIG. 1. In exemplary embodiments, the shape of the second contact plug 118 may not be limited to a specific shape, and may have, e.g., a pillar shape, a cylindrical shape, a linear shape, or the like.

Figure 15:
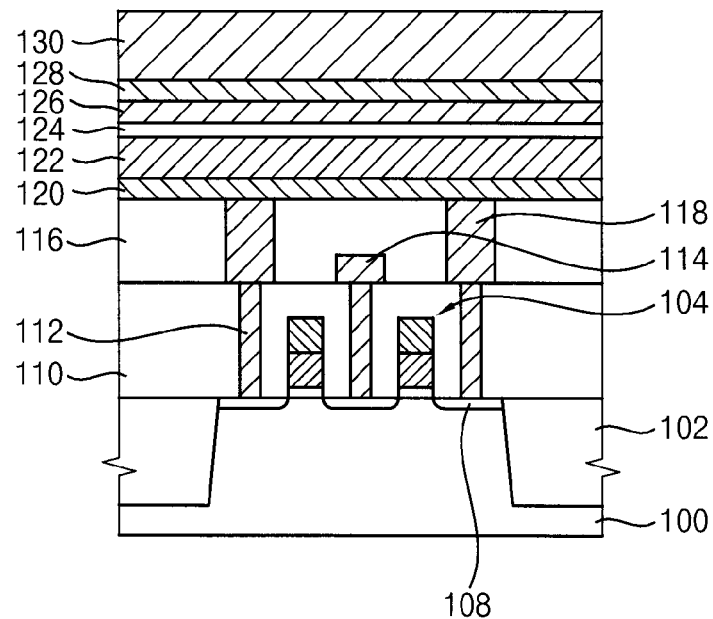

Referring to FIG. 15, a first electrode layer 120 may be formed on the second insulating interlayer 116 and the second contact plug 118. A first magnetic layer 122 may be formed on the first electrode layer 120. A tunnel barrier layer 124 may be formed on the first magnetic layer 122. A second magnetic layer 126 may be formed on the tunnel barrier layer 124. A capping layer 128 may be formed on the second magnetic layer 126. An upper electrode layer 130 may be formed on the capping layer 128. The first magnetic layer 122, the tunnel barrier layer 122, the second magnetic layer 124, the capping layer 128 and the upper electrode layer 130 may be substantially the same as those illustrated with reference to FIG. 1, respectively.

Figure 16:
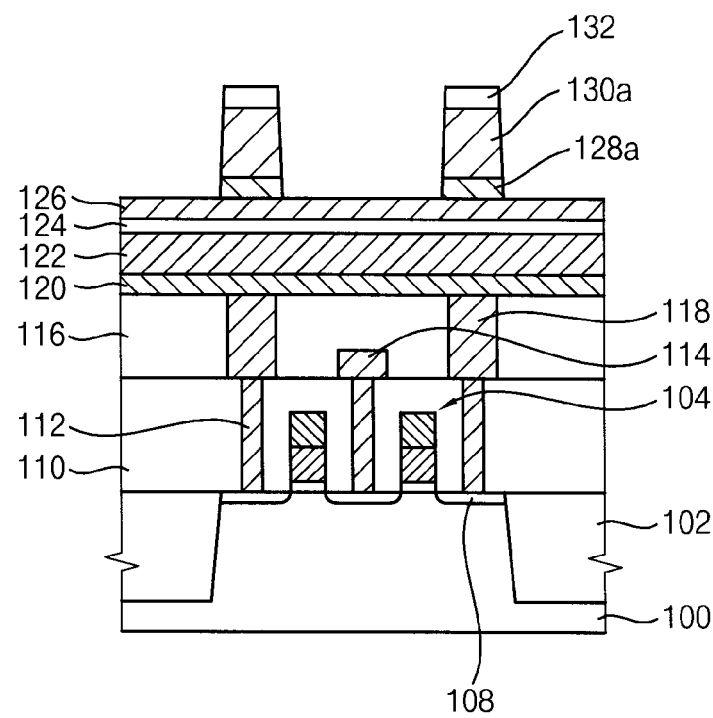

Referring to FIG. 16, a hard mask layer may be formed on the upper electrode layer 130. The hard mask layer may be formed to include, e.g., silicon nitride. The hard mask layer may be etched using a photoresist pattern (not shown) as an etching mask to form a hard mask 132. In exemplary embodiments, the hard mask 132 may be formed by a double patterning process that may include performing a photo process twice. The hard mask 132 may overlap the second contact plug 118. Also, the hard mask 132 may be formed to cover an upper portion of the second contact plug 118.

The upper electrode layer 130 and capping layer 128 may be etched using the hard mask 132 as an etching mask to form an upper electrode 132a and a capping pattern 128a, respectively. The hard mask 132 may be mostly or completely removed during the etching process.

The upper electrode layer 130 and the capping layer 128 may be etched by an RIE process or an IBE process. In exemplary embodiments, the upper electrode layer 130 and the capping layer 128 may be etched by the RIE process using an etching gas.

Figure 17:
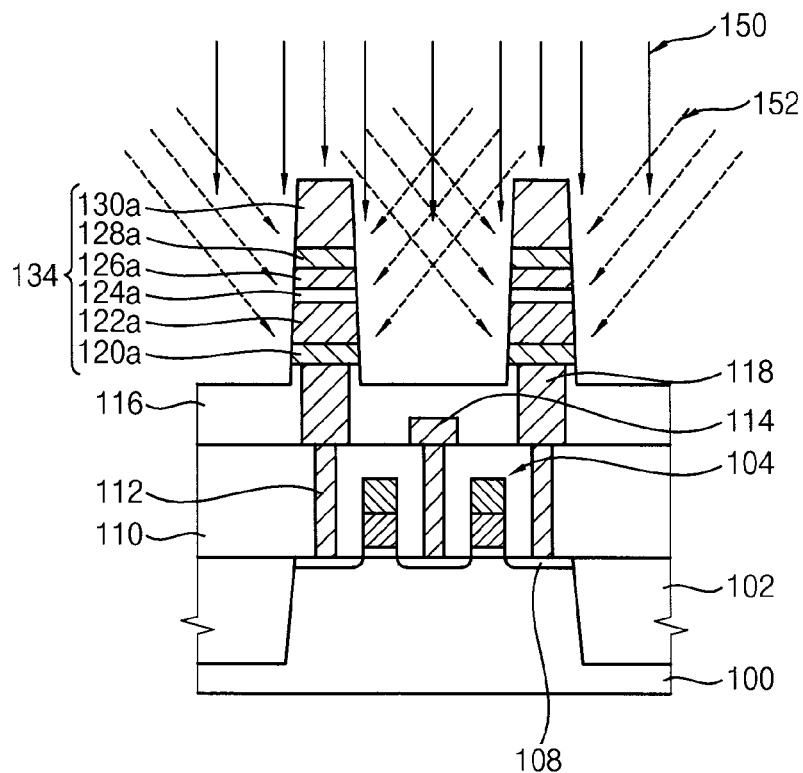

Referring to FIG. 17, the second magnetic layer 126, the tunnel barrier layer 124, the first magnetic layer 122, the first electrode layer 120 and a portion of the second insulating interlayer 116 may be sequentially etched using the upper electrode 130a and the capping pattern 128a as an etching mask. Thus, an MTJ structure 134 including a first electrode pattern 120a, a first magnetic pattern 122a, a tunnel barrier pattern 124a, a second magnetic pattern 126a, capping pattern 128a and the upper electrode 130a may be formed to be sequentially stacked on the second insulating layer 116.

The MTJ structure 134 may contact an upper surface of the second contact plug 118. A lower surface of the MTJ structure 134 may have an area greater than that of the upper surface of the second contact plug 118, so that the MTJ structure 134 may cover the upper surface of the second contact plug 118.

The etching process for forming the MTJ structure 134 may include a physical etching process, e.g., an IBE process. For example, the etching process may include an argon ion sputter etching process.

In the etching process, independent ion beam sources may emit ion beams, respectively, having different incident angles from each other onto an etching target layer for forming the MTJ structure. For example, a first ion beam 150 having a first incident angle with respect to a top surface of the substrate 100 may be emitted from a first ion beam source (not shown), and a second ion beam 152 having a second incident angle with respect to the top surface of the substrate 100 may be emitted from a second ion beam source (not shown). The first and second incident angles may be different from each other. In example embodiments, the first incident angle may be about 60° to about 90°, and the second incident angle may be about 20° to about 50°. Thus, the first ion beam may etch the etching target layer, and the second ion beam may etch conductive by-products that may be re-deposited onto the sidewall of the MTJ structure 134.

The etching process may be substantially the same as those illustrated with reference to FIG. 4. The conductive by-products may not remain on the sidewall of the MTJ structure 134.

Figure 18:
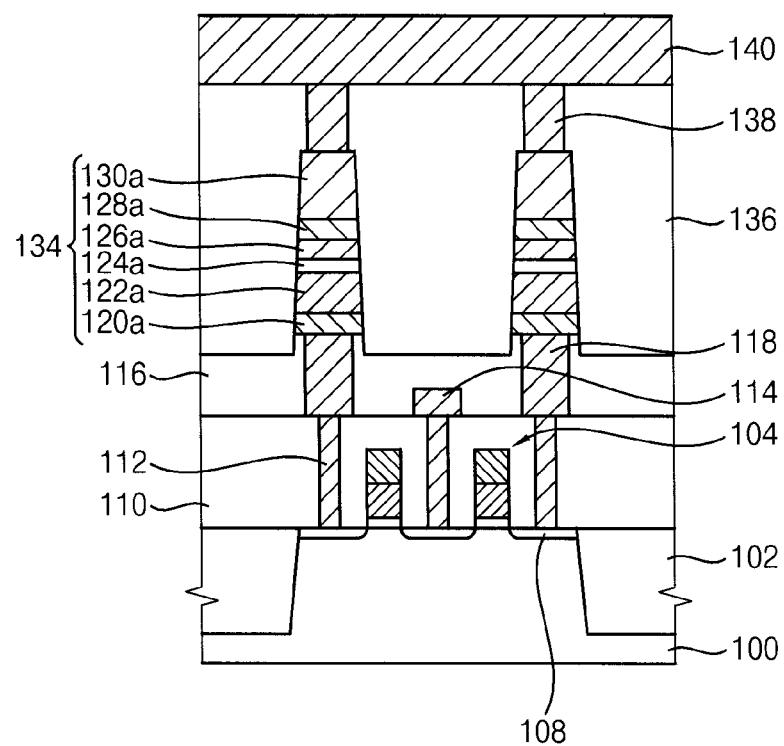

Referring to FIG. 18, a third insulating interlayer 136 may be formed on the second insulating interlayer 116 to cover the MTJ structure 134. A third contact hole (not shown) may be formed through a portion of the third insulating interlayer 136 to expose the upper electrode 130a. A conductive material may be filled into the third contact hole to form a third contact plug 138. The third contact plug 138 may serve as an upper electrode contact. The third contact plug 138 may include a metal, e.g., tungsten, copper, aluminum, titanium, ruthenium, etc., and/or a metal nitride, e.g., titanium nitride, etc.

A bit line 140 may be formed on the third insulating interlayer 136 to contact the third contact plug 132, and may extend in the second direction. The bit line 140 may include a metal, e.g., tungsten, copper, aluminum, titanium, ruthenium, etc., and/or a metal nitride, e.g., titanium nitride, etc. A metal wiring pattern (not shown) may be further formed on the bit line 134, and may be electrically connected to a peripheral circuit (not shown).

In exemplary embodiments, the MTJ structure 134 may be formed by processes illustrated with reference to FIGS. 1 to 5. Alternatively, the MTJ structure 134 may be formed by processes illustrated with reference to FIGS. 6 and 7, FIGS. 8 and 9, or FIGS. 10 and 11. That is, any of the processes illustrated with reference to FIGS. 6 and 7, FIGS. 8 and 9, and FIGS. 10 and 11 may be performed instead of the processes illustrated with reference to FIGS. 13 to 15 for forming the MTJ structure 134.

The MTJ structure of FIG. 1 may be included in a memory cell of an MRAM device.

Figure 19:
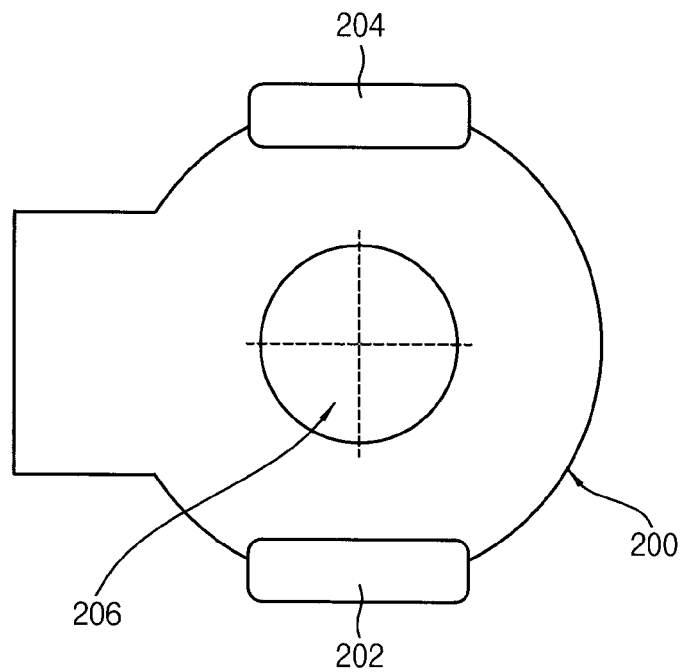
Figure 20:
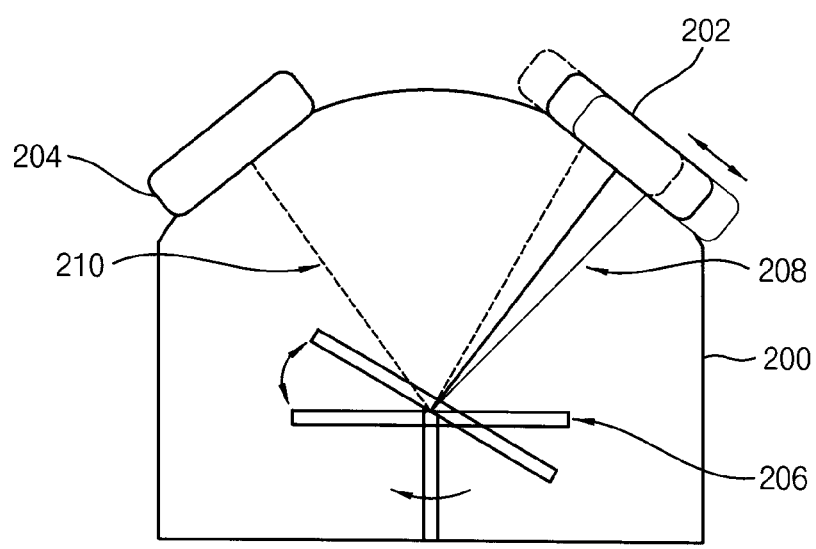

FIG. 19 is a plan view illustrating an etching apparatus for forming MTJ structures in accordance with exemplary embodiments. FIG. 20 is a cross-sectional view illustrating the etching apparatus of FIG. 19.

Referring to FIGS. 19 and 20, the etching apparatus may include a process chamber 200, a first ion source 202, and a second ion source 204. The process chamber 200 may include a stage 206 therein, which may be rotatable and tiltable. A substrate including an etch target layer may be loaded on the stage 206.

Each of the first and second ion sources 202 and 204 may be formed at a sidewall of the process chamber 200. Each of the first and second ion sources 202 and 204 may be arrange to face the stage 206. The first ion source 202 may emit a first ion beam 208 having a first incident angle with respect to the top surface of the substrate. The second ion source 204 may emit a second ion beam 210 having a second incident angle with respect to the top surface of the substrate.

In exemplary embodiments, the first and second ion beam sources 202 and 204 may be an ICP source generating plasma. Alternatively, the first and second ion beam sources may be a CCP source generating plasma. The ICP source may generate plasma using an induced magnetic field by a R.F. antenna including coils. The CCP source may generate plasma using a vertical electric field by a voltage between flat electrodes substantially parallel to each other, which may be caused by applying an R.F. power to the flat electrodes.

At least one of the first and second ion beam sources 202 and 204 may be moveable. In exemplary embodiments, the first ion beam source 202 may be moveable, and the second ion beam 204 may be fixed. Thus, the first and second ion beam sources 202 and 204 may control the first and second incident angles, respectively.

For example, when the first ion beam source 202 is moveable and the second ion source 204 is fixed, the first and second incident angles may be controlled by the following process.

The stage 206 may be tilted so that the second ion beam 210 having the second incident angle may be emitted from the second ion source 204. The first ion source 202 may be moved so that the first ion beam 208 having the first incident angle with respect to a tilted substrate on the stage 206 may be emitted from the first ion source 202. Thus, the first and second ion beams 208 and 210 having different incident angles or substantially the same incident angle may be simultaneously emitted, so that the etching target layer on the substrate may be etched.

Alternatively, when the first and second ion beam sources 202 and 204 are moveable, the first and second incident angles may be controlled by the following process.

The first ion source 202 may be moved so that the first ion beam 208 having the first incident angle may be emitted from the first ion source 202. Alternatively, the stage 206 may be tilted so that the first ion beam 208 having the first incident angle may be emitted from the first ion source 202. The second ion source 204 may be moved so that the second ion beam 210 having the second incident angle with respect to a substrate on the stage 206 may be emitted from the second ion source 204. Thus, the first and second ion beams 208 and 210 having different incident angles or substantially the same incident angle may be simultaneously emitted, so that the etching target layer on the substrate may be etched.

Figure 21:
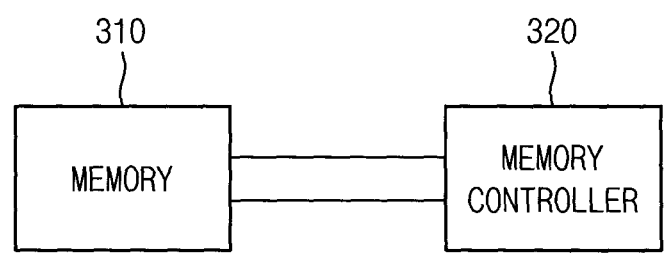

FIG. 21 is a block diagram illustrating a memory system in accordance with exemplary embodiments.

Referring to FIG. 21, the memory system may include a memory controller 320 and a memory 310 connected to the memory controller 320. In exemplary embodiments, the memory 310 may include the MRAM device of FIG. 18. The memory controller 320 may provide a control signal for controlling the memory 310.

The MRAM device according to exemplary embodiments may be used in various types of electronic devices, e.g., mobile devices, memory cards, computers, etc.

According to exemplary embodiments, the MTJ structure may be formed with no electrical short therein. The processes for forming the MTJ structure may be used in manufacturing an MRAM device.

What is claimed is:

1. A method of manufacturing a magnetoresistive random access memory (MRAM) device, the method comprising:
   forming a lower electrode on a substrate;
   forming a first magnetic layer, a tunnel barrier layer, and a second magnetic layer sequentially on the lower electrode layer;
   forming an etching mask on the second magnetic layer; and
   performing an ion beam etching process in which a first ion beam and a second ion beam are simultaneously emitted onto the substrate to form a magnetic tunnel junction (MTJ) structure including a first magnetic layer pattern, a tunnel layer pattern, and a second magnetic layer pattern from the first magnetic layer, the tunnel barrier layer, and the second magnetic layer, respectively,
   wherein the MTJ structure has no by-products remaining after the ion beam etching process is performed,
   wherein the first ion beam is emitted from a first ion beam source and has a first incident angle,
   wherein the second ion beam is emitted from a second ion beam source and has a second incident angle,
   wherein one of the first ion beam source and the second ion beam source is movable, and the other of the first ion beam source and the second ion beam source is fixed, and
   wherein the first incident angle and the second incident angle are adjusted by moving the one of the first ion beam source and the second ion beam source so that the MTJ structure has no by-products remaining.

2. The method of claim 1, wherein the first incident angle and the second incident angle are different from each other.

3. The method of claim 2, wherein the first incident angle is about 60° to about 90°, and the second incident angle is about 20° to about 50°.

4. The method of claim 1, wherein the performing the ion beam etching process comprises:
   tilting the substrate to adjust the first incident angle and the second incident angle.

5. The method of claim 1, wherein the performing the ion beam etching process comprises adjusting the first incident angle and the second incident angle, and wherein the adjusting the first incident angle and the second incident angle comprises:
tilting the substrate so that the second ion beam is incident on the substrate at the adjusted second incident angle; and
moving the first ion beam source so that the first ion beam is incident on the tilted substrate at the adjusted first incident angle.

6. The method of claim 1, further comprising:
forming a first electrode layer between the lower electrode and the first magnetic layer,
wherein the first electrode layer is etched to form a first electrode by the ion beam etching process.

7. The method of claim 1, wherein in the ion beam etching process, the first ion beam etches the second magnetic layer, the tunnel barrier layer, and the first magnetic layer, and the second ion beam removes the by-products on the MTJ structure.

8. The method of claim 1, further comprising:
forming a capping layer and an upper electrode layer between the second magnetic layer and the etching mask.

9. The method of claim 8, further comprising:
etching the capping layer and the upper electrode layer by a reactive ion etching process or the ion beam etching process.

10. The method of claim 1, further comprising:
etching the first magnetic layer, the tunnel barrier layer, and the second magnetic layer by the ion beam etching process using at least one of the first ion beam and the second ion beam to form a preliminary magnetic tunnel junction (MTJ) structure which comprises the by-products on a sidewall of the preliminary MTJ structure, after forming the etching mask.

11. The method of claim 10, wherein the first ion beam and the second ion beam are emitted onto the preliminary MTJ structure, and
wherein the first incident angle is about 60° to about 90°, and the second incident angle is about 20° to about 50°.

12. The method of claim 10, wherein the first ion beam and the second ion beam are incident on the preliminary MTJ structure, and each of the first incident angle and the second incident angle is about 20° to about 50°.

13. A method of manufacturing a magnetoresistive random access memory (MRAM) device, the method comprising:
forming a metal-oxide-semiconductor (MOS) transistor having an impurity region on a substrate;
forming an insulating interlayer on the substrate to cover the MOS transistor;
forming a lower electrode through the insulating interlayer layer, the lower electrode contacting the impurity region of the MOS transistor;
forming a first magnetic layer, a tunnel barrier layer, and a second magnetic layer sequentially on the lower electrode and the insulating interlayer layer;
forming an etching mask on the second magnetic layer;
performing an ion beam etching process in which a first ion beam and a second ion beam are simultaneously emitted onto the substrate to form a magnetic tunnel junction (MTJ) structure including a first magnetic layer pattern, a tunnel layer pattern, and a second magnetic layer pattern from the first magnetic layer, the tunnel barrier layer and the second magnetic layer, respectively, wherein the MTJ structure has no by-products remaining after the ion beam etching process is performed,
wherein the first ion beam is emitted from a first ion beam source and has a first incident angle,
wherein the second ion beam is emitted from a second ion beam source and has a second incident angle; and
forming a wiring electrically connected to the second magnetic layer,
wherein one of the first ion beam source and the second ion beam source is movable, and the other of the first ion beam source and the second ion beam source is fixed, and
wherein the first incident angle and the second incident angle are adjusted by moving the one of the first ion beam source and the second ion beam source so that the MTJ structure has no by-products remaining.

14. The method of claim 13, wherein the first incident angle and the second incident angle are different from each other.

15. A method of performing an ion beam etching process, the method comprising:
performing a first ion beam etching process in which a first ion beam is emitted on a substrate, a lower electrode disposed on the substrate, and an etching target layer disposed on the lower electrode such that by-products are deposited onto a sidewall of a pattern structure;
performing a second ion beam etching process in which a second ion beam is emitted on the substrate, the lower electrode disposed on the substrate, and the etching target layer disposed on the lower electrode; and
forming a magnetic tunnel junction (MTJ) structure comprising the pattern structure after the first ion beam etching process and the second ion beam etching process are performed,
wherein the MTJ structure has no by-products remaining after the first ion beam etching process and the second ion beam etching process are performed
wherein one of a first ion beam source which emits the first ion beam and a second ion beam source which emits the second ion beam is movable, and the other of the first ion beam source and the second ion beam source is fixed, and
wherein the first ion beam and the second ion beam are adjusted by moving the one of the first ion beam source and the second ion beam source so that the MTJ structure has no by-products remaining.

16. The method of claim 15, wherein the first ion beam has a different incident angle than the second ion beam.

17. The method of claim 15, wherein the first ion beam etching process forms the pattern structure from the etching target layer.

18. The method of claim 15, wherein the second ion beam etching process removes the by-products onto the sidewall of the pattern structure.

19. The method of claim 15, further comprising:
tilting the substrate to adjust a first incident angle of the first ion beam and a second incident angle of the second ion beam.

* * * * *